Figure 1:
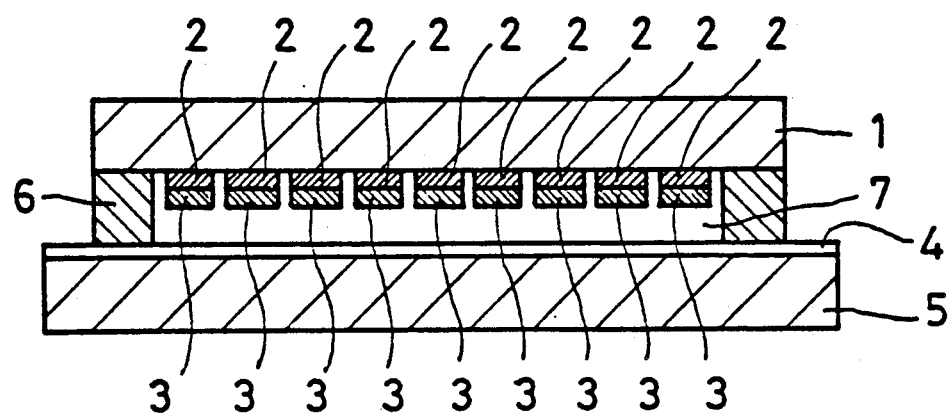

United States Patent [19]

Iwasa et al.

[11] Patent Number: 4,670,188
[45] Date of Patent: Jun. 2, 1987

[54] ELECTRICALLY CONDUCTIVE HIGH MOLECULAR RESIN COMPOSITION FOR ELECTRODEPOSITION COATING

[75] Inventors: Koji Iwasa; Hitoshi Kamamori; Mitsuru Suginoya; Yutaka Sano; Yumiko Terada; Naoki Kato, all of Koto; Tameyuki Suzuki, Zushi; Jun-ichi Yasukawa, Chigasaki; Toyokazu Nomura, Narashino; Kazuo Tohda, Katsushika; Shinji Itoh, Narashino, all of Japan

[73] Assignees: Seiko Instruments & Electronics Ltd., Tokyo; Shinto Paint Co., Ltd., Amagasaki, both of Japan

[21] Appl. No.: 706,608

[22] Filed: Feb. 28, 1985

[30] Foreign Application Priority Data

Mar. 2, 1984 [JP] Japan ................................ 59-40787

[51] Int. Cl.4 ............................................. H01B 1/06
[52] U.S. Cl. ..................................... 252/513; 252/514; 252/518; 524/430; 524/440
[58] Field of Search ...................... 252/513, 514, 518; 524/430, 439, 440; 204/181.4, 181.6, 181.7; 106/1.05, 1.12, 1.13, 1.14, 1.18, 1.19; 350/330, 336

[56] References Cited

U.S. PATENT DOCUMENTS 4,052,209 10/1977 Huffman et al. .................... 252/500
4,303,554 12/1981 Sudo et al. ........................... 252/518
4,511,218 4/1985 Frits ..................................... 252/518
4,594,182 6/1986 Hashumoto et al. ............... 252/518

FOREIGN PATENT DOCUMENTS 0132068 1/1985 European Pat. Off. .
0132068 1/1985 European Pat. Off. .
23830/85 2/1985 Japan .

Primary Examiner—Josephine L. Barr
Attorney, Agent, or Firm—Wenderoth, Lind & Ponack

[57] ABSTRACT

An electrically conductive composition for electrodeposition coating comprises (A) a pigment and at least one cationic high molecular resin and (B) electrically conductive ultra-fine particles having an average particle diameter less than 0.8 $\mu$, the amount of (A) being 96–50% by weight and the amount of (B) being 4–50% by weight of the total solid content of the composition.

1 Claim, 1 Drawing Figure

ELECTRICALLY CONDUCTIVE HIGH MOLECULAR RESIN COMPOSITION FOR ELECTRODEPOSITION COATING

The present invention relates to an electrically conductive high molecular composition for electrodeposition coating which is mainly applicable to display elements and can form a transparent colored coating film. More particularly, the invention relates to a transparent electrically conductive high molecular composition for electrodeposition coating useful as a transparent coloring material for color filters used in various multicolored display elements such as liquid crystal display elements or in optical machines and instruments.

As for the materials and coloring methods of color filters it has been contrived for example to color gelatin film with dyestuff, or to color it by printing. However, such methods or materials have many problems to be solved: In the method of coloring gelatin film, since gelatin as a material is chemically weak, there is a limit in durability and use conditions on the one hand, and the photolithography, i.e. the method of film formation, necessiates extremely complicated process steps on the other hand. Furthermore, in producing a multicolored filter, only necessary portions of the gelatin layer must be colored, and therefore a resist printing treatment must be applied to the portions which must not be colored. This makes the process complicated. An example of the process by photolithography using gelatin as a coloring layer is explained in the following.

First, on a glass substrate, a transparent electrically conductive layer is formed which is patterned and composed mainly of tin oxide, indium oxide, etc. A thin layer of gelatin is applied, and exposure, development and rinsing are carried out according to the method of photolithography so as to leave a gelatin layer in coincidence with the patterned transparent electrically conductive layer. After a mask for resist printing is applied, exposure, development and rinsing are conducted according to the photolithographic method to remove the resist printing film of only the patterned portion for which the coloring is necessary. Then a dyeing bath is used for coloring the patterned portion. The remaining portion of the resist printing film is peeled off. By following the process steps mentioned above, one color can be colored on the necessary pattern. Upon coloring a second color, the same process steps are repeated, starting from the application of resist printing film. When producing a three-color filter of red, green and blue, this coloring step is repeated three times, and then finally the filter is rinsed thoroughly with water and dried. As mentioned above, the coloring by the photolithography using gelatin has problems in both the durability of the material and the complexy of the process steps. Therefore, a material and method with a higher practicability is demaned. The printing method is simpler as a process in comparison with the above-mentioned photolithographic method, but there is a limit in the fineness of practicable patterning, and also it is extremely difficult for the printing method to make a colored layer completely in coincidence with a transparent electrode and thus there has been a limit in practicability.

In the light of such a situation we made an intensive study to solve such problems, and as a result, be have found a coloring material which makes it possible to apply a new method called high molecular electrodeposition to the production of color filters used for display elements, etc., and which can form a transparent colored coated film having electric conductivity. This discovery led to the present invention.

The present invention provides an electrically conductive high molecular composition which contains a high molecular resin, a coloring matter and electrically conductive ultrafine particles, the latter having an average particle diameter less than $0.8\mu$ and constituting 4 to 50 weight %, preferably 5 to 20 weight %, of the total solid content, and which can form transparent colored coated film and is used mainly for display elements.

In the following, the present invention is explained in detail.

First, there will be explained the method of producing multicolored filters by high molecular electrodeposition: The first step of this method is to produce an electrically conductive transparent electrode of tin oxide, indium oxide, antimony oxide, etc. in a patterned shape on a glass substrate (this product hereinafter called transparent electrode pattern). The second step comprises making a high molecular electrodeposition liquid by diluting the high molecular electrodeposition composition with pure water so that the solid content will be 4 to 25%, and in this liquid are immersed a counter-electrode made of platinum, stainless steel, etc. and the glass substrate onto which the above-mentioned transparent electrode pattern is adhered. Then a direct current of about 5 to 300 volts is caused to pass between the transparent electrode pattern to be colored and the counter-electrode. At this time, when the high molecular electrodeposition composition is anionic as mentioned later, electric voltage is applied, taking the transparent electrode pattern as the positive electrode, and when cationic, the same as the negative electrode. By this electric voltage application, the high molecular electrodeposition composition migrates only toward the voltage-applied pattern and deposites as a coated film, thus coloring the transparent electrode pattern. To obtain a necessary film thickness, the electrodeposition conditions such as electric voltage, duration of electrodeposition treatment, liquid temperature, etc. are suitably regulated. The usual coated film thickness after drying is less than $5\mu$. Usually, the electrodeposition duration is 5 to 180 seconds, and the liquid temperature is 10° to 30° C. After the electrodeposition duration to obtain a necessary film thickness has passed, the electricity is turned off, the glass substrate is taken out of the bath, the bath liquid adhering to it in excess is thoroughly rinsed with pure water, and then the coated film is cured by heating. In this way, an electrically conductive transparent electrode pattern colored in one color can be produced. The third step, taking as an example the production of a multicolored filter of red, green and blue, is to repeat the second coloring step two times for the other colors on the transparent electrode pattern to be colored. By following the above-mentioned method, a multicolored filter of three colored layers having electric conductivity can be produced by high molecular electrodeposition. This method does not necessiate the photolithographic process upon coloring, and also does not require the resist printing treatment, so that the process is simpler. Moreover, the transparent electrode pattern and the colored layer come in complete coincidence and a fine pattern can be colored. In addition, chemically stable and durable materials can be used. Thus, this method can completely solve the problems in the photolithographic method and the printing method.

Next, an explanation is given on the electrically conductive high molecular resin electrodeposition composition capable of forming the transparent colored layer, used for the high molecular electrodeposition which the present invention provides. The composition is composed of:

(i) an anionic or cationic synthetic high molecular resin as the film-forming component of the coated film.

(ii) electrically conductive ultra-fine particles which give electric conductivity to the coated film, (iii) a coloring matter such as pigment or dye which imparts a transparent color to the coated film, and as bath components, includes in addition:

(iv) organic solvents used for regulating the electrodeposition characteristics or bath liquid stability or to make the production easy, (v) a neutralizing agent for solubilizing the synthetic high molecular resin in water, (vi) various auxiliaries for improving the coated film surface, electrodeposition characteristics, bath liquid stability, etc.

In the following, a detailed explanation is set forth about the components:

The synthetic high molecular resin used as the film-forming component of the coated film is an anionic or cationic high molecular resin. The anionic synthetic high molecular resins include acrylic resins, polyester resins, maleic resins, polybutadiene resins, epoxy resins, etc. These are used singly or as a mixture, or used together with cross-linking resins such as melamine resins, phenol resins, urethane resins, etc. The cationic synthetic high molecular resins include acrylic resins, epoxy resins, urethane resins, polybutadiene resins, polyamide resins, etc. These are used singly or as a mixture, or in combination with cross-linking resins such as urethane resins, polyester resins, etc. As anionic synthetic high molecular resins, it is preferable to use acrylic resins or polyester resins singly or as a mixture or in combination with melamine resins, and as cationic synthetic high molecular resins it is preferable to use acrylic resins or epoxy resins singly or as a mixture or in combination with urethane resins, in respect of transparency, color characteristics, etc. These resins are neutralized with an alkali or acid substance so as to be solubilized in water so that they can be used for electrodeposition. That is to say, the anionic synthetic high molecular resins are neutralized with amines such as triethylamine, diethylamine, dimethylethanolamine, diisopropanolamine, etc. or inorganic alkalis such as ammonia, caustic potash, etc. The cationic synthetic high molecular resins are neutralized with acids such as acetic acid, formic acid, propionic acid, lactic acid, etc. and water-solubilized and used in a water-diluted state as water dispersion or water solution.

The amount of the neutralizing agent to be used is indicated by a MEQ value, and its method of measurement is described in Example 1. This characteristic value is an important value because it exerts a great influence on the stability of electrodeposition bath, current efficiency, the state of finish of coated film and the state of electrodeposition surface. In the case of a cationic electrodeposition bath, the applicable range is from 15 to 50, preferably from 20 to 40. In the case of an anionic electrodeposition bath, the applicable range is from 40 to 130, preferably from 50 to 100. At a value lower than each lower limit, the stability of electrodeposition bath may be impaired. At a value exceeding each upper limit, there may be caused a decrease of current efficiency, worthening of the state of coated film resulting therefrom, elution or destruction of coated film.

As the electrically conductive ultra-fine particles which impart electric conductivity to the coated film, there may be mentioned ultra-fine particles of semi-conductive oxides such as tin oxide, indium oxide, antimony oxide, zinc oxide, cadmium oxide, etc. and ultra-fine particles of chemically stable metals such as gold, silver, nickel, etc. In order that the transparency of the coated film is not impaired, these ultra-fine particles must be dispersed to an average particle diameter of less than $0.8\mu$ which is the upper limit of the visible light wave length. When the average particle diameter is less than $0.2-0.3\mu$, the coated film assumes a practically desirable transparency. The content of the particles varies depending on the desired electric conductivity of the coated film, or the specific gravity of the particles. However, the content is 4 to 50 weight %, preferably 10 to 25 weight %, of the solid matter of the total composition. At a content less than 4%, there is little effect contributing to the electric conductivity. At a content exceeding 50%, the throwing power as an electrodeposition characteristic will be impaired, so that it is difficult to maintain a smooth and even coated film.

The electric conductivity of coated film is especially useful for producing a good display effect without causing a drop of effective voltage of the display element, when used for a display material activated by a low voltage such as liquid crystal display material. The specific resistance of coated film may be the same as or less than the electric resistance value of the liquid crystal used, and usually it is less than $10^{12}\Omega cm$.

As the coloring matter which gives transparent coloration to the coated film, pigments or dyes can be used. As for the pigments, those must be selected that do not cause problems on the transparency of the coated film obtained, and as for the dyes, those that do not cause problems on the bath stability, electrodeposition characteristics, durability of coated film, etc. In this respect, suitable pigments are organic pigments such as phthalocyanine pigments or threne pigments, and inorganic oxide pigments such as iron oxide, etc. As for the dyes, oil-soluble dyes or disperse dyes are suitable. In order to obtain a good coated film, the electrically conductive ultra-fine particles and the coloring matter used such as pigments should be preferably purified and removed from impurities before use.

To the composition of the present invention, it is desirable to add organic solvents for the purposes of:

(i) obtaining a smooth coated film, (ii) improving the bath stability, (iii) faciliating dispersion, etc.

Such organic solvents which are mainly used are hydrophilic solvents including cellosolves such as ethyl-, butyl-, methylcellosolves, etc., alcohols such as isopropanol, butanol, glycol, carbitol, etc. However, as the case may be, hydrophobic solvents such as xylol, toluol, mineral turpentine, etc. may be used.

The auxiliaries that can be used are dispersing agents for improving the dispersibility of pigments, leveling agents for improving the smoothness of the coated film, defoaming agents for stopping the foaming of the bath, etc.

The composition of the present invention is dispersed by means of generally used dispersing apparatus such as sand mill, pearl mill, roll mill, attritor, etc. The composition must be sufficiently dispersed so as to obtain the transparency and smoothness of the coated film. The electrically conductive ultra-fine particles and pigments are diluted with a solvent and mixed with the synthetic high molecular resin which has been neutralized. Auxiliaries are then added, and finally the mixture is diluted with pure water to a definite concentration, normally to a solid content of about 4 to 25 weight %, and thereafter it is submitted to electrodeposition. The electrodeposition is performed according to the previously mentioned method.

The coated film obtained from the composition of the present invention is durable and electrically conductive, so that it is very useful as a color filter used especially for liquid crystal display material characterized by low voltage operation.

In the following the present invention is concretely explained by way of Examples, wherein parts are by weight unless otherwise indicated.

EXAMPLE 1

The following three colored cationic electrodeposition liquids were produced:

|  | Blue | Green | Red |
|---|---|---|---|
| Acrylic resin (product of Shinto Paint Co. Ltd.) | 60 parts | 60 parts | 60 parts |
| Ethyl cellosolve | 30 | 30 | 30 |
| Isopropyl alcohol | 3 | 3 | 3 |
| Acetic acid (neutralizing agent) | 1.8 | 1.8 | 1.8 |
| Ion-exchanged water | 875.2 | 875.2 | 875.2 |
| Tin oxide (T-1, product of Mitsubishi Metal Co.) | 10 | 10 | 10 |
| Silver (ultra-fine particles, product of Shinku Yakin Co.) | 5 | 5 | 5 |
| Phthalocyanine Blue (SP-1500, product of Sanyo Shikiso Co.) | 15 | — | — |
| Phthalocyanine Green (SAX, product of Sanyo Shikiso Co.) | — | 15 | — |
| Azo metal salt red pigment (Pigment Red, product of Sanyo Shikiso Co.) | — | — | 15 |
|  | 1000 | 1000 | 1000 |

To a mixed liquid of 40 parts of the acrylic resin and ethyl cellosolve, the tin oxide, silver (ultra-fine particles) and coloring matter were added under stirring and mixed. The mixture was rolled by means of a three-roll mill for laboratory use (manufactured by Kodaira Seisakusho) until the pigment was dispersed to a particle diameter of less than 0.3μ. For the measurement of the particle diameter, a Coulter Counter N4 was used.

To this dispersed mixture, the remaining acrylic resin and the isopropyl alcohol were added and stirred for 15 minutes. After neutralization with the aqueous acetic acid solution under stirring, the mixture was diluted with the ion-exchanged water to produce an electrodeposition bath composed of the electrically conductive high molecular resin composition.

The characteristic data of the acrylic resin used were as follows: Non-volatile matter 75 weight %, basicity value 1.0, and viscosity 60 poises (25° C.).

The bath liquid obtained had a MEQ value of 40, and contained as electrically conductive pigments, tin oxide and silver in an amount of 25 weight % in total in the solid matter.

Measuring methods of the basicity value and the MEQ value are shown below:

Measurement of the basicity value

A basic resin containing no acid compound and not neutralized is taken in an Erlenmeyer flask so that the solid matter becomes about 1 gr. 60 cc dioxane is added so that the resin is sufficiently dissolved (if necessay heated). Two or three drops of methyl red are added and the solution is titrated with 1/10 N—HCl. The cc number required to reach the color change point is converted to the basic resin per gram. This value is taken as the basicity value of the basic resin.

Measurement of the MEQ value

An amount of 20 ml of the sample is weighed, and to this sample 100 ml tetrahydrofuran is added and stirred. While dropping a 1/10 N-alcoholic KOH solution, the pH values are measured with a pH meter to draw a titration curve. From the two points of inflection in the titration curve, the middle point is obtained. The titration amount of the 1/10 N-alcoholic KOH solution required to reach this middle point is obtained. Then, by the MEQ calculation formula, the acid concentration is calculated.

$$MEQ = \frac{20 \times V \times f}{S \times C} \times 50$$

wherein V is the titration amount (ml) of the 1/10 N-alcoholic KOH solution required to reach the middle point, f is the factor of the 1/10 N-alcoholic KOH solution, S is the weight (gr) of the sample, and C is the residual amount of the sample after heating.

The electrodeposition bath thus produced was stirred at 20° C. A glass plate was used as the substrate. On this substrate, an indium oxide electrically conductive film was formed by spray coating method. The thus-obtained transparent substrate was used as the negative electrode and a platinum plate as the counter electrode, and between these two electrodes an electric voltage of 20 V was applied for 30 seconds.

The acrylic resin in the colored layer formed by electrodeposition is then cured by cross-linking reaction by baking. The resin can be cured by baking in air at 175° C. for 30 minutes, but when it is desired to increase the fastness of the colored layer, the duration is prolonged or the baking is carried out under reduced pressure. The film thickness of the colored layer after curing was 1.5 μm.

Each of the cured colored layers had an excellent transparency and was colored evenly. Their specific volume resistance was $10^{10} \Omega cm$.

EXAMPLE 2

The following anionic electrodeposition bath liquid was produced:

|  | Blue |
|---|---|
| Polyester resin (product of Shinto Paint Co.) | 60 parts |
| Melamine resin (Nikalac MX-40, product of Sanwa Chemical) | 15 |
| Butyl cellosolve | 45 |
| n-Butanol | 5 |
| Triethylamine | 4 |
| Ion-exchanged water | 851 |
| Tin oxide (electrically conductive ultra-fine particles | 12 |

|  | Blue |
| --- | --- |
| T-1, product of Mitsubishi Metal Co.) | |
| Phthalocyanine Blue | 8 |
| (SR-150C, product of Sanyo Shikiso Co.) | |
| Phthalocianine Green | — |
| (SAX, product of Sanyo Shikiso Co.) | |
| Azo metal salt red pigment | — |
| (Pigment Red 4BS, product of Sanyo Shikiso Co.) | |
| | 1000 |

Fourty parts out of the 60 parts of the polyester resin (non-volatile matter 75%, acid value (mg number of KOH required to neutralize 1 gr of the solid content of the resin) 50 and viscosity at 25° C. 60 poises), 45 parts of butyl cellosolve, tin oxide and phthalocyanine blue were milled by means of a dispersing machine Sand Grind Mill (product of Asada Iron Works) until the pigment was dispersed to a particle diameter of $0.3\mu$.

For the measurement of the particle diameter, a Coulter Counter N4 (product of Coulter Counter Co.) was used.

To the composition in which the pigment was dispersed to a particle diameter less than $0.3\mu$, the remainder polyester resin, melamine resin and n-butanol were added, and the mixture was thoroughly mixed, neutralized with triethanolamine, and diluted with ion-exchanged water to produce an electrodeposition bath of the electrically conductive high molecular resin electrodeposition composition.

The measurement of acid value was conducted by the following method:

Measurement of acid value

A definite amount of the resin is dissolved in a definite amount of alcohol or ether, and the solution is titrated with ½ N—KOH, using phenolphthalein as the indicator.

The mg number of KOH required for the titration is converted to the solid matter of resin per gr, and the value is taken as the acid value.

This bath liquid contains 15 weight % tin oxide in the solid matter as the electrically conductive pigment.

The electrodeposition bath thus produced was stirred at 20° C. A glass plate was used as the substrate. On this substrate, an electrically conductive indium oxide film was formed by spray coating method. The thus-obtained transparent substrate was used as the positive electrode and a platinum plate as the counter electrode. Between these two electrodes an electric voltage of 20 V was applied for 30 minutes.

The polyester resin and melamine resin in the colored layer formed by electrodeposition were cured by cross-linking reaction by baking. The baking was carried out in air at 175° C. for 30 minutes.

The cured film obtained was an evenly colored layer of of excellent transparency like that obtained in Example 1. Its specific volume resistance was $10^{10}\Omega$cm.

EXAMPLE 3

The following anionic electrodeposition bath liquid was produced:

| Polyester resin | 60 parts |
| --- | --- |
| (Shinto Paint Co. Ltd.) | |
| Melamine resin | 15 |
| (Nikalac MX-40, Sanwa Chemical) | |
| Butyl cellosolve | 45 |
| n-Butanol | 5 |
| Triethylamine | 4 |
| Ion-exchanged water | 851 |
| Indium oxide | 12 |
| (ultra-fine particles, Shinku Yakin Co.) | |
| Phthalocyanine Green | 8 |
| (SAX, Sanyo Shikiso Co.) | |
| | 1000 |

The electrically conductive high molecular resin was produced in the same way as in Example 2, using all the components except ion-exchanged water, and then the resin was diluted with ion-exchanged water In this Example, the same method as in Example 2 was carried out except that indium oxide was used in place of tin oxide.

Using this bath liquid and in the same way as in Example 2, electrodeposition and curing were performed to obtain an evenly colored layer of excellent transparency. Its specific volume resistance was $10^{10}\Omega$cm.

EXAMPLE 4

Using the three colored bath liquids produced in Example 1, a multicolored display apparatus as shown in FIG. 1 was produced. In the following the process is explained.

(1.) Patterning step

Reference numeral 1 is a display substrate composed of a transparent material, and on this display substrate, a transparent electrically conductive film of indium oxide is formed by spray-coating. The transparent electrically conductive film is patterned in stripe form by etching, and display electrodes 2 are obtained.

(2) Electrodeposition step

Into the cationic electrodeposition bath produced in Example 1, the display substrate 1 is immersed on which the display electrodes 2 were formed. Among the display electrodes patterned in stripe form, those which are desired to be colored in the same color are selected. With the selected electrodes as the negative electrodes, an electric voltage of 20 V is applied for 3 minutes. After the application of the electric voltage is finished, the display substrate 1 is drawn out of the bath and sufficiently rinsed with water so that the solution adhering to the portions to which the electric voltage was not applied, is washed off. After water washing and drying, a colored layer of good transparency is formed on the electrodes to which the voltage was applied.

(3) Curing step

The polyacrylic resin in the colored layer formed by electrodeposition is cured by cross-linking reaction by baking. By baking in air at 175° C. for 30 minutes, the colored layer is completely cured. The colored layer which was cured has an electric conductivity such that the specific volume resistance is $10^{10}$ $\Omega$cm, but this electric conductivity is not so large that, if the layer is immersed in the electrodeposition bath again for another electrodeposition, no more electrodeposition will occur. Therefore, as for the formation of the second and further colored layers, display electrodes to be colored in another color are again selected, and the step of electrodeposition in the electrodeposition bath of a different color and the step of curing are repeated.

In this Example, color filters 3 (see FIG. 1) in stripe form having a width of 200 $\mu$m arranged in the order of red, blue and green could be produced very simply and conveniently by the steps of patterning, electrodeposition of the red electrodes, curing, electrodeposition of the blue electrodes, curing, electrodeposition of the green electrodes and curing.

A cell was formed so that the display substrate 1 on which color filters 3 had been formed was united with the transparent counter substrate 5 on which the counter electrodes 4 had been formed in stripe form, in such a way that the display electrodes 2 and the stripes of the counter electrodes could be crosses at right angles through the intermediary of spacers 6. As display material 7, liquid crystals TN-FEN were filled in the cell, to thus produce a multicolored liquid crystal display apparatus, Between the display electrodes 2 of this multicolored display apparatus and the counter electrodes 4, an electric voltage was applied. The cell was placed between a polarizer and analyzer whose transparent axes were parallel, and when it was seen from the display substrate 1 or the counter substrate 5, the color of the transparent color filters 3 was displayed.

Furthermore, because of the electric conductivity imparted to the color filter layer, the voltage transmittance characteristic in the electro-optical characteristics of the multicolored display apparatus produced according to the present invention was almost equal to the voltage transmittance characteristic of the liquid crystal material itself.

Thus, by using the transparent electrically conductive high molecular electrodeposition composition of the present invention, it has become possible to produce a multicolored display apparatus in a very simple and convenient way. It has become apparent that its display quality is excellent and moreover even if it is used for a low voltage operated display material such as liquid crystals, the operation voltage of the display elements is not lowered.

COMPARATIVE EXAMPLE 1

The following cationic electrodeposition bath liquid was produced:

| | |
|---|---|
| Acrylic resin (Shinto Paint Co. Ltd.) | 60.0 parts |
| Ethyl cellosolve | 30.0 |
| Isopropyl alcohol | 3.0 |
| Acetic acid (neutralizing agent) | 1.8 |
| Ion-exchanged water | 896.1 |
| Tin oxide (electrically conductive particles, T-1 Mitsubishi Metal Co.) | 1.1 |
| Phthalocyanine Blue (SR-105C, Sanyo Shikiso Co.) | 8.0 |
| | 1000.0 |

The bath was produced in the same way as in Example 1 except that the amount of tin oxide was different.

This bath liquid had a MEQ value of 40 and contained 2.0 weight % tin oxide in the solid matter as the electrically conductive pigment. But the specific volume resistance of the colored layer obtained by electrodeposition was $10^{14} \Omega cm$. This value is almost equal to the specific volume resitance of a colored layer containing no tin oxide. Therefore, no effect of addition of the electrically conductive pigment tin oxide was observed.

COMPARATIVE EXAMPLE 2

The following cationic electrodeposition bath liquid was produced:

| | |
|---|---|
| Acrylic resin (Shinto Paint Co.) | 60.0 parts |
| Ethyl cellosolve | 30.0 |
| Isopropyl alcohol | 3.0 |
| Acetic acid (neutralizing agent) | 1.8 |
| Ion-exchanged water | 832.7 |
| Tin oxide (T-1, Mitsubishi Metal Co.) | 64.5 |
| Phthalocyanine Green (SAX, Sanyo Shikiso Co.) | 8.0 |
| | 1000.0 |

The method of producing the bath was the same as in Example 1 except that the amount of tin oxide was different.

This bath liquid had a MEQ value of 40 and contained 55 weight % tin oxide in the solid matter as the electrically conductive pigment.

Electrodeposition was carried out in the same way as in Example 1, using this bath liquid. The throwing power was bad and the colored layer obtained had an uneven thickness and was insufficient in gloss and transparency.

As concretely mentioned hereinabove in Examples, the electrically conductive high molecular electrodeposition composition according to the present invention can form an electrically conductive colored layer having a good transparency by electrodeposition. It can be used for color filters of various multicolored display material and optical instruments, and especially when it is used for a low voltage operated display material such as liquid crystals, it realizes a high display quality and a high reliability, without lowering the operation voltage.

FIG. 1 shows an example of the multicolored display apparatus in which the electrically conductive high molecular resin composition of the present invention is used.

What we claim is:

1. An electrically conductive composition for electrodeposition coating consisting essentially of (A) a pigment and at least one cationic high molecular resin selected from the group consisting of acrylic resins, epoxy resins, urethane resins, and polybutadiene resins and (B) electrically conductive ultra-fine particles of at least one member selected from the group consisting of tin oxide, indium oxide, antimony oxide, cadmium oxide, zinc oxide, gold, silver and nickel, having an average particle diameter less than $0.8\mu$, the amount of (A) being 96–50% by weight and the amount of (B) being 4–50% by weight of the total solid content of the composition.

* * * * *